United States Patent [19]

Tanigawa

[11] Patent Number: 5,436,187
[45] Date of Patent: Jul. 25, 1995

[54] PROCESS FOR FABRICATING A SEMICONDUCTOR MEMORY DEVICE INCLUDING A CAPACITOR HAVING A CYLINDRICAL STORAGE NODE ELECTRODE

[75] Inventor: Takaho Tanigawa, Toyko, Japan
[73] Assignee: NEC Corporation, Tokyo, Japan
[21] Appl. No.: 199,647
[22] Filed: Feb. 22, 1994
[51] Int. Cl.6 ................. H01L 21/70; H01L 27/00
[52] U.S. Cl. .................................. 437/52; 437/47; 437/60; 437/919
[58] Field of Search ............... 437/52, 919, 60, 47

[56] References Cited

U.S. PATENT DOCUMENTS

| | | | |
|---|---|---|---|
| 4,974,040 | 11/1990 | Taguchi et al. | 257/306 |
| 5,140,389 | 8/1992 | Kimura et al. | 257/309 |
| 5,150,276 | 9/1992 | Gonzalez et al. | 361/313 |
| 5,185,282 | 2/1993 | Lee et al. | 437/52 |
| 5,223,448 | 6/1993 | Su | 437/47 |
| 5,266,512 | 11/1993 | Kirsch | 437/47 |

FOREIGN PATENT DOCUMENTS 62-48062  3/1987 Japan .
3091957  4/1991 Japan .

Primary Examiner—Olik Chaudhuri
Assistant Examiner—H. Jey Tsai
Attorney, Agent, or Firm—Sughrue, Mion, Zinn, Macpeak & Seas

[57] ABSTRACT

A process for fabricating a semiconductor device having a capacitor is disclosed. The process comprises the steps of: providing a semiconductor substrate having a transistor formed therein; forming an interlayer insulating film over a surface of the semiconductor substrate; forming in sequence a first polysilicon film and a first insulating film on a surface of the interlayer insulating film; selectively removing the first insulating film and the first polysilicon film to define a core made of the first insulating film and a bottom electrode made of the first polysilicon film; forming in sequence an undoped second polysilicon film and a second insulating film over the core and the bottom electrode; selectively removing the second insulating film to leave a part of the second insulating film, the part of the second insulating film serving as a cylindrical spacer which surrounds sidewalls of the core and the bottom electrode with intervention of the second polysilicon film; selectively removing a portion the second polysilicon film using the cylindrical spacer as a mask to form an undoped-polysilicon-film spacer interposed between the core and the cylindrical spacer; removing the cylindrical spacer and the core with leaving the bottom electrode and the undoped-polysilicon-film spacer; and introducing an impurity into the undoped-polysilicon-film spacer to form a cylindrical electrode, and to form a storage node electrode comprising the cylindrical electrode and the bottom electrode, the storage node electrode serves as one electrode of the capacitor.

12 Claims, 6 Drawing Sheets

PROCESS FOR FABRICATING A SEMICONDUCTOR MEMORY DEVICE INCLUDING A CAPACITOR HAVING A CYLINDRICAL STORAGE NODE ELECTRODE

BACKGROUND OF THE INVENTION

1. Field of the Invention

The present invention relates to a process for fabricating a semiconductor memory device, and more particularly to a process for fabricating a DRAM having a stacked-type capacitor comprising a cylindrical storage node electrode.

2. Description of the Related Art

The most widely employed capacitor structure for present day DRAMs is a stacked-type capacitor structure. A stacked-type capacitor having a cylindrical storage node electrode is known in the art. A conventional process of fabricating a cylindrical storage node electrode is disclosed, for example, in Japanese Patent Laid-Open No. S62-48062. The process of fabricating a DRAM having a stacked-type capacitor having a cylindrical storage node electrode disclosed in the above mentioned patent specification is described below by reference to FIGS. 1a to 1e. FIGS. 1a to 1e illustrate cross sectional views for a fabricating process for a semiconductor memory device in accordance with the prior art.

First, as shown FIG. 1a, a field oxide film 2 is formed on the surface of a p-type silicon substrate 1, and then a MOS transistor comprising a gate oxide film 3, gate electrode 4 serving also as a word line, a n+ source region 5a, and a n+ drain region 5b is constructed thereon. An interlayer insulating film 6b, at least a surface of which is made of a material other than a silicon oxide film, is deposited over the entire surface of the wafer by a CVD technique. A node contact hole 7 exposing n+ drain region 5b is opened in this interlayer insulating film 6b. Over the entire surface of the wafer an undoped polysilicon film is deposited by a CVD technique. Then, the undoped polysilicon film is ion-implanted or thermally diffused with a dopant, such as phosphorus, to obtain a n+ polysilicon film. Over the entire surface of the wafer a silicon oxide film of a specified thickness is deposited by a CVD technique. Using a patterned photoresist film 10 as a mask covering at least the area just above the node contact hole 7, the silicon oxide film and then the n+ polysilicon film are anisotropically etched to form a core 9b and a bottom electrode 8a, respectively.

In the next step, as shown FIG. 1b, after removing photoresist film 10, an undoped polysilicon film is formed on the entire wafer surface by a CVD technique and then doped to obtain a n+ polysilicon film 31 by ion implantation or thermal diffusion of phosphorus. Etch back of the n+ polysilicon film 31 follows, as shown FIG. 1C, leaving only on a sidewall of core 9b to form a cylindrical electrode 31a of a n+ polysilicon film. Thereafter, as shown FIG. 1d, core 9b is removed, for example, by wet etching with a buffered hydrofluoric acid, to thereby form a cylindrical storage node electrode having a bottom electrode 8a and a cylindrical electrode 31a. As shown FIG. 1e, dielectric film 13 and a cell plate electrode 14 are subsequently formed to complete a stacked-type capacitor having a cylindrical storage node electrode.

In the above mentioned process, the cylindrical electrode 31a, a part of the cylindrical storage node electrode, is formed by etch back, for example, by reactive ion etching (RIE). The resulting height of cylindrical electrode 31a depends on the height of core 9b and also on the etch back time needed to completely expose the surface of interlayer insulating film 6b and core 9b determines the uniformity of the cylindrical electrode 31a. Thus, if the etch rate of n+ polysilicon film 31 is uniform and the height of core 9b is uniform, then the height of cylindrical electrode 31a will be uniform.

Practically, however, the etching rate varies within the same silicon wafer in a range of about ±5% furthermore the height of core 9b has a variation of about ±5%. These variations result in nonuniformity in the height of cylindrical electrode 31a within the same semiconductor memory device, which results in variation of the surface area of the storage node. This in turn results in variation of the storage capacitance among memory cells, which causes unstable circuit operation such as degradation of the electrical characteristics of a power supply voltage margin or noise margin, etc.

BRIEF SUMMARY OF THE INVENTION

It is a primary objective of this invention to solve the above mentioned problems of the prior art, and to provide a process for fabricating a semiconductor memory device having uniformly dimentioned storage capacitors.

The above objective is achieved by providing a process for fabricating a semiconductor device having a capacitor, the process comprising the steps of: providing a semiconductor substrate having a transistor formed therein; forming an interlayer insulating film over a surface of the semiconductor substrate; forming in sequence a first polysilicon film and a first insulating film on a surface of the interlayer insulating film; selectively removing the first insulating film to define a core made of the first insulating film; selectively removing the first polysilicon film to define a bottom electrode made of the first polysilicon film; forming in sequence an undoped second polysilicon film and a second insulating film over the core; selectively removing the second insulating film to leave a part of the second insulating film, the part of the second insulating film serving as a cylindrical spacer which surrounds sidewall of the core with intervention of the second polysilicon film; selectively removing a portion of the second polysilicon film using the cylindrical spacer as a mask to form an undoped-polysilicon-film spacer interposed between the core and the cylindrical spacer; removing the cylindrical spacer and the core with leaving the bottom electrode and the undoped-polysilicon-film spacer; and introducing an impurity into the undoped-polysilicon-film spacer to form a cylindrical electrode, and to form a storage node electrode comprising the cylindrical electrode and the bottom electrode, the storage node electrode serves as one electrode of the capacitor.

In the above embodiment, a stacked capacitor may be prepared in a known manner by forming a dielectric film over the storage node electrode and forming a cell plate electrode over the dielectric film.

BRIEF DESCRIPTION OF THE DRAWINGS

The above and further objects, features and advantages of the present invention will become more apparent from the following detailed description of the embodiments taken in conjunction with the accompanying drawings, wherein.

DETAILED DESCRIPTION OF THE PREFERRED EMBODIMENTS

Figure 1A:
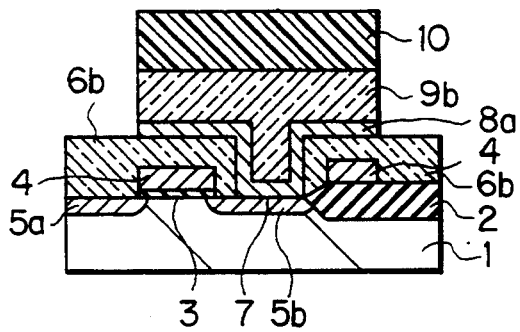
FIGS. 1a to 1e are cross-sectional views illustrating the process steps for fabricating a capacitor according to a prior art process.
Figure 1D:
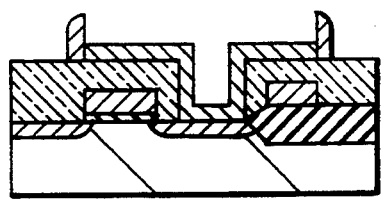
Figure 1B:
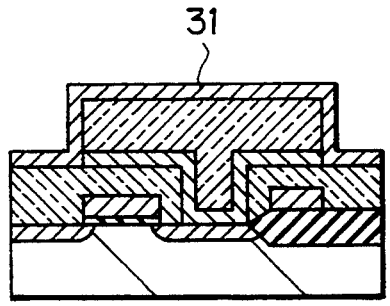
Figure 1E:
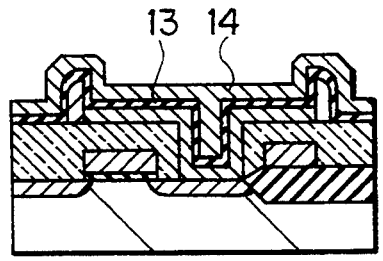

Referring to FIGS. 2a to 2f which illustrate the cross-sections of the process of fabricating a semiconductor memory device, the first embodiment of the present invention is described in detail as follows.

First, a field oxide film 2 is formed on the surface of a p-type silicon substrate 1, and a MOS transistor comprising a gate oxide film 3, gate electrode 4 serving also as word lines, an n+ source region 5a, and an n+ drain region 5b is fabricated thereon as described, for example, in U.S. Pat. No. 5,172,202 at col. 6, line 16 to 38. Then, an interlayer insulating film 6a having a total thickness of about 500 to 600 nm is formed over the entire surface by well known CVD technique. A top surface of the interlayer insulating film 6a is made of silicon nitride film having a thickness of about 30 nm. In this interlayer insulating film 6a, a node contact hole 7 is opened to expose n+ drain region 5b. Over the entire surface an undoped polysilicon film having a typical thickness of about 100 nm is formed by a low pressure CVD technique as a first polysilicon film and then doped to a n+ polysilicon film by ion implantation or thermal diffusion of phosphorus. Then, over the entire surface a silicon oxide film having a thickness of about 400 nm is formed as a first insulating film by CVD technique. Using a patterned photoresist film 10 covering at least the node contact hole 7 as a mask, the silicon oxide film and the n+ polysilicon film are anisotropically etched in sequence to form a core 9a and a bottom electrode 8a.

Figure 2A:
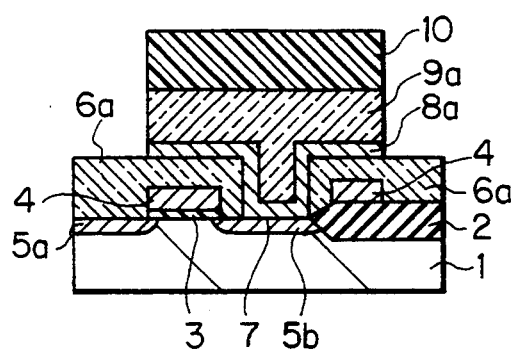
FIGS. 2a to 2f are cross-sectional views illustrating process steps for fabricating a capacitor according to a first embodiment of the present invention.
Figure 2D:
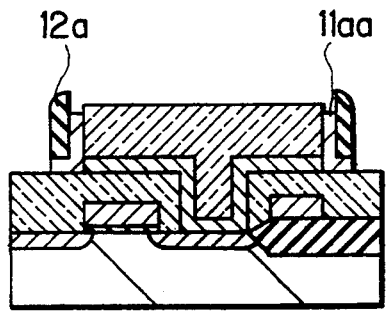
Figure 2B:
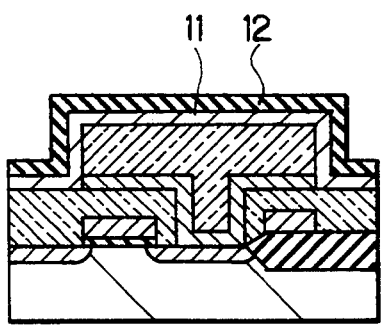

As shown in FIG. 2b, after removing photoresist film 10, an undoped polysilicon film 11 having a thickness of about 150 nm is formed on the entire surface by a low pressure CVD technique as a second polysilicon film, and then on the entire surface a silicon oxide film 12 having a thickness of about 100 nm is formed by a CVD technique as a second insulating film.

Figure 2E:
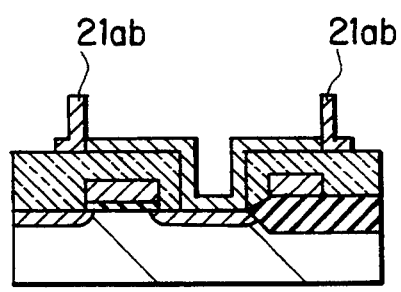
Figure 2C:
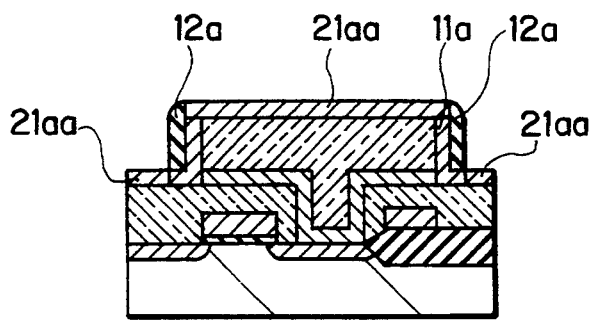

As shown in FIG. 2c, the silicon oxide film 12 is anisotropically etched by RIE, leaving a part of the silicon oxide film 12 to form a cylindrical spacer 12a around the core 9a having undoped polysilicon film 11 interposed between opposing sidewalls. Phosphorus ion implantation at a dose of $1 \times 10^{15}$ (cm$^{-2}$) to $2 \times 10^{16}$ (cm$^{-2}$) is carried out in a substantially vertical direction to the substrate 1 into undoped polysilicon film 11. Cylindrical spacer 12a functions as a mask for this ion implantation into undoped polysilicon film 11. Thermal treatment at a temperature of 800° to 900° C. in a nitrogen atmosphere follows the ion implantation. As the result of the series of treatments, the exposed surface parts of undoped polysilicon film 11 are doped to n+ polysilicon films 21aa to leave only the part of undoped polysilicon film 11 covered with cyrindrical spacer 12a as undoped polysilicon film 11a.

As shown in FIG. 2d, the polysilicon film is etched back by RIE using a mixed gas of CCl$_2$F$_2$ and N$_2$, to remove n+ polysilicon film 21aa. In this RIE, undoped polysilicon film 11a is partially etched to obtain undoped-polysilicon-film spacer 11aa, a spacer formed around the sidewall of the core 9a.

Figure 3:
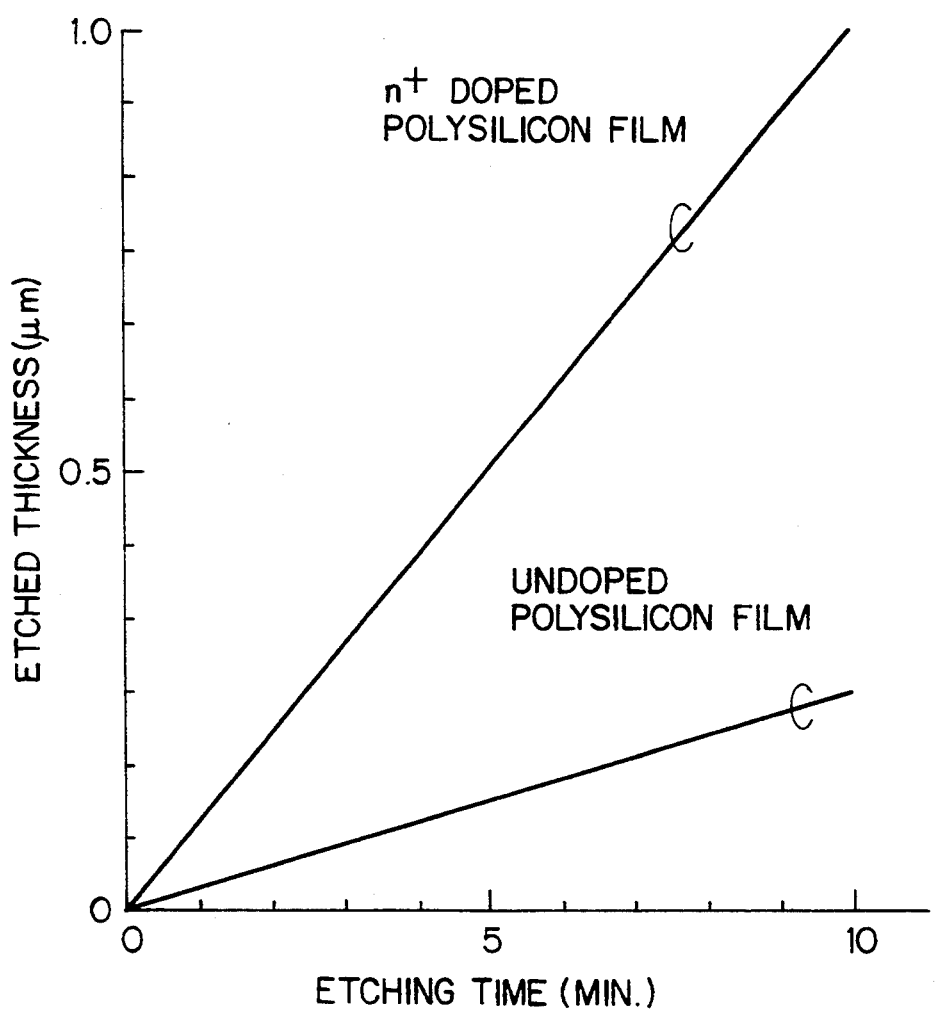
FIG. 3 is a graph of etched thickness as a function of etching time for n+ doped polysilicon films and undoped polysilicon films.
Figure 4:
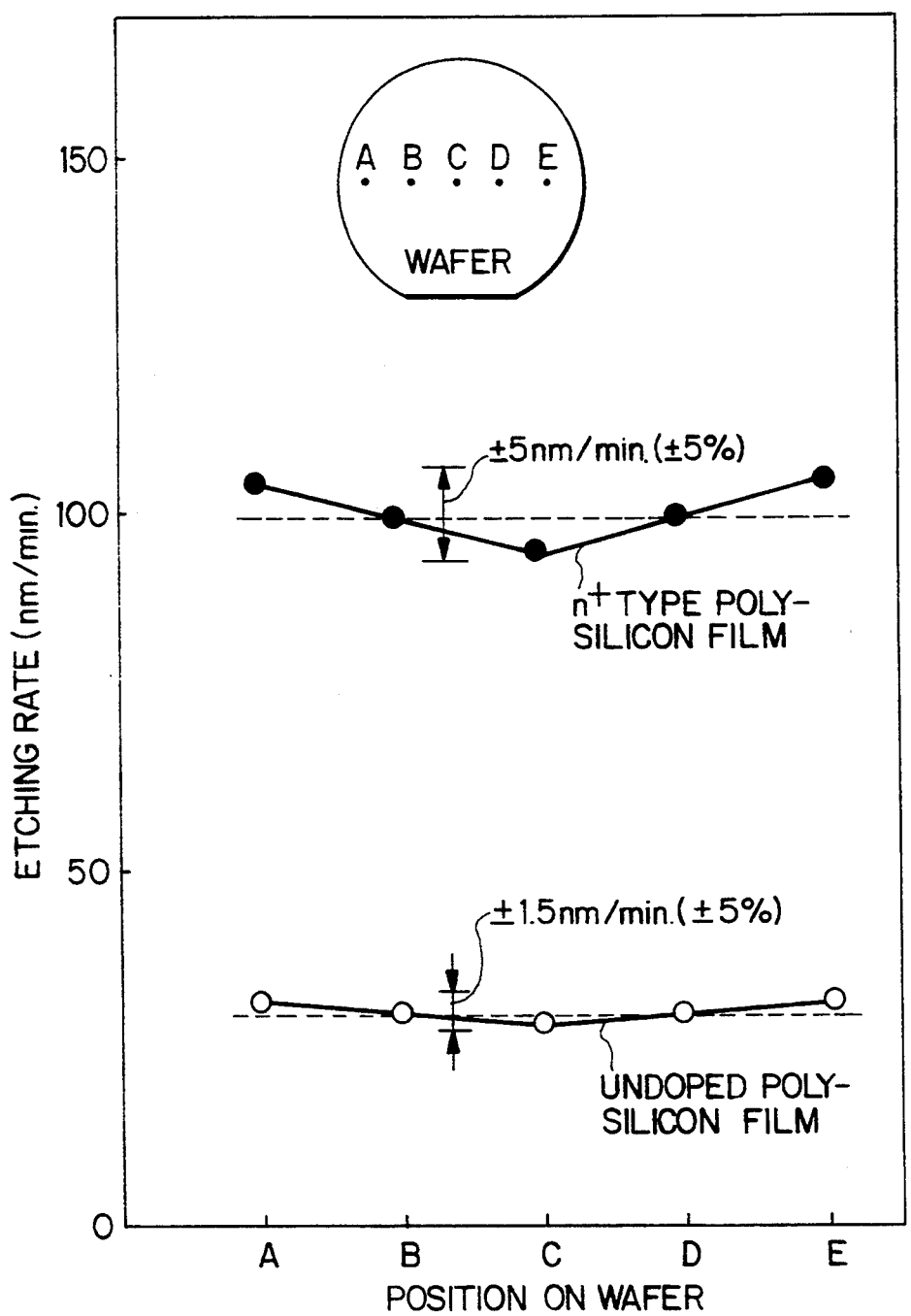
FIG. 4 is a graph of etching rate as a function of wafer position for both n+ doped polysilicon films and undoped polysilicon films.

The RIE is described in detail below. Referring to FIG. 3 which is a graph of etching rates, the average etching rates in RIE of n+ polysilicon film (upper curve) and undoped polysilicon film (lower curve) are about 100 nm/min and about 30 nm/min, respectively. It follows that the etching rate of the undoped polysilicon film is approximately one-third that of the n+ polysilicon film. In reference to FIG. 4 which also shows variation in etching rate as a function of location across the same silicon wafer, the etching rate variation percentages of the n+ polysilicon film and the undoped polysilicon film are both about ±5% while the etching rate variations of the n+ polysilicon film and the undoped polysilicon film are ±5 nm/min and ±1.5 nm/min, respectively.

The manner in which n+ polysilicon film 21aa is removed by RIE to leave undoped polysilicon film 11a is discussed below. In this RIE, to prevent a short circuit between the storage nodes of the memory cells, n+ polysilicon film 21aa must be fully removed. For example, an etching time of 15 minutes removes 150 nm of n+ polysilicon film. To assure complete removal (due to thickness and processing variations) of n+ polysilicon film having average thickness of 150 nm, 50% over-etching for $15 \times 150\% = 22.5$ minutes is preferred to thereby leave undoped polysilicon film 11aa.

Figure 1C:
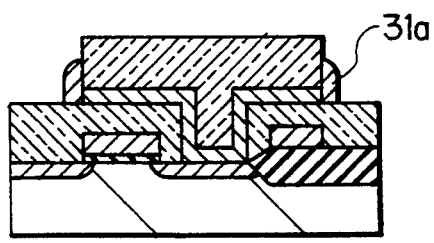
Figure 5A:
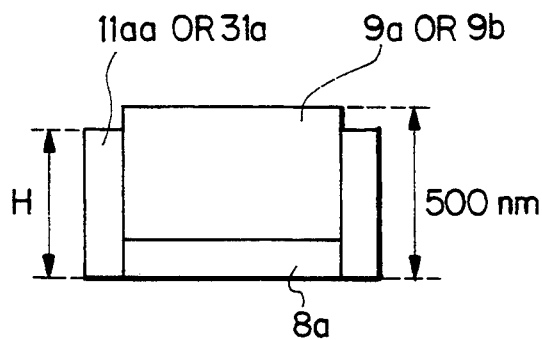
FIGS. 5a and 5b are a schematic cross-sectional view and a graph of film height as a function of wafer position in accordance with the first embodiment of the present invention, respectively.
Figure 5B:
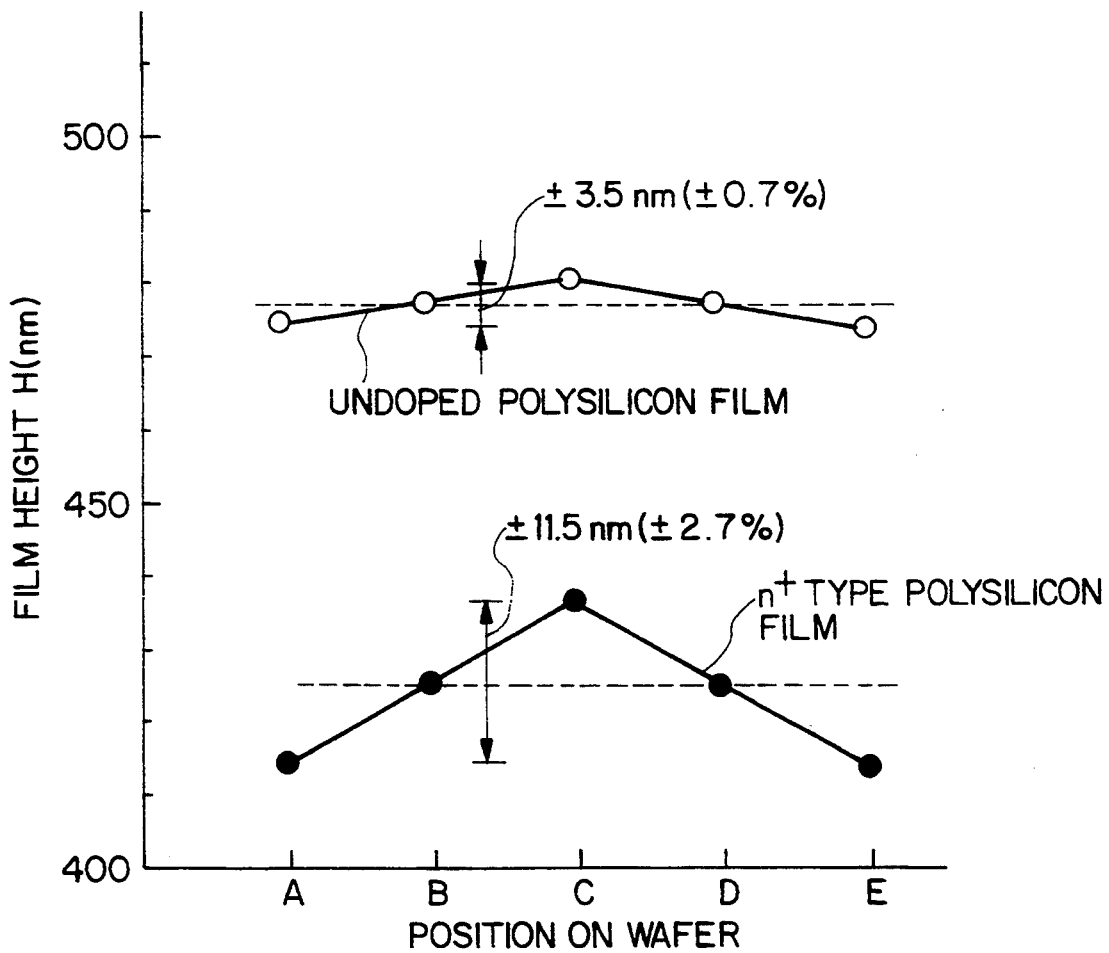

The following is in reference to FIG. 5a which is a schematic section illustrating the RIE-overetching and FIG. 5b is a graph showing the variation in the height "H" of the polysilicon films in FIG. 5a across the diameter of the same silicon wafer. Position "C" is the center of the wafer and position "A" and "E" are at the respective edges of the wafer. The upper curve of FIG. 5b is for undoped polysilicon (e.g., 11aa) and the lower curve is for n+ doped polysilicon (e.g., 31 m). Assuming that the summed film thickness of n+ polysilicon film 8a and silicon oxide film 9a (or silicon oxide film 9b) is uniform (500 nm) within the same silicon wafer, the height "H" of undoped-polysilicon-film spacer 11aa obtained by the RIE will be 457±3.5 nm with a variation of ±0.7% while the height of n+ polysilicon film spacer 31a by a conventional technique (See FIG. 1c) will be 425±11.5 nm with a variation of ±2.7%.

In the next step, as shown in FIG. 2e, wet etching is carried out with a buffered hydrofluoric acid to remove core 9a and cylindrical spacer 12a. Phosphorus ion implantation is carried out at a dose of $1 \times 10^{15}$ (cm$^{-2}$) to $2 \times 10^{-16}$ (cm$^{-2}$) into the undoped-polysilicon-film spacer 11aa to render it conductive in order to obtain cylindrical electrode 21ab. The cylindrical electrode 21ab together with bottom electrode 8a form a cylindrical storage node electrode. The height of cylindrical electrode 21ab is equal to the height of undoped-polysilicon-film spacer 11aa.

Figure 2F:
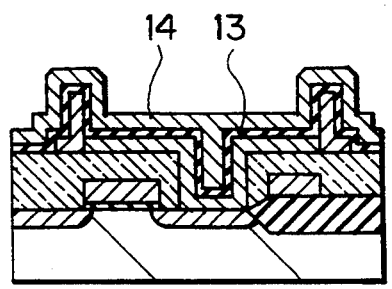

Then, as shown in FIG. 2f, dielectric film 13 of about 5 nm calculated in terms of the silicon dioxide film and cell plate electrode 14 of n+ type polysilicon film having a thickness of about 100 nm are formed in a known and conventional manner. Thus, the formation of a stacked type capacitor having a cylindrical storage node electrode according to the present invention is achieved.

In the first embodiment as shown in FIG. 5b, the height of cylindrical electrode 21ab, a component of a cylindrical storage node electrode, is equal to the height of undoped-polysilicon-film spacer 11aa. Thus, there is a small variation in height of the spacer 11aa as compared with a conventional process. In addition, because the etching rate of undoped polysilicon is much lower than n+ polysilicon, the height of cylindrical electrode 21ab (prepared by RIE followed by doping) is higher than the height of corresponding cylindrical electrode 31a of the prior art (prepared by doping followed by RIE), all other things being equal. Thus, this embodiment of the invention has the effect of reducing the variation in storage capacitance of the memory cell which causes instability of the circuit operation such as degradation of power supply voltage margin, noise margin, and other characteristics. This embodiment has the additional effect of increasing storage capacitance itself of the memory cell compared with a conventional fabricating process.

In the first embodiment of the invention, at least a surface of the interlayer insulating film 6b preferably comprises a silicon nitride film, and the first and second insulating films (e.g., core 9a and silicon oxide film 12) preferably comprise a silicon oxide film, but these film compositions are not particularly restrictive. When at least the surface of the interlayer insulating film comprises a silicon nitride film, the first and second insulating films comprise a phosphosilicate glass (PSG) film or a borophosphosilicate glass (BPSG) film. In this case, removal of the cylindrical spacer 12a of the second insulating film and the core 9a of the first insulating film is carried out by selective etching with buffered hydrofluoric acid. When the interlayer insulating film 6b comprises a silicon oxide film and the first and second insulating films comprise a PSG or BPSG film, removal of the cylindrical spacer 12a and the core 9a is preferably carried out by vapor etching with hydrogen fluoride gas. In this case, if the pressure of hydrogen fluoride gas is about 600 Pa, then the etching rates of the first and second insulating films are about $10^2$ to $10^3$ times larger than that of the interlayer insulating film 6b. When the interlayer insulating film 6b comprises a silicon oxide, BSG or BPSG film, and the first and second insulating films comprises a PSG film, removal of the cylindrical spacer 12a and the core is carried out by selective wet etching with dilute hydrofluoric acid.

The first polysilicon film can be doped to n+ type and then patterned as in the first embodiment (See FIG. 2a). Also, it can be converted to n+ type at the same time as the second polysilicon film.

In reference to FIGS. 6a to 6c which illustrate cross-sections of the process of fabricating a semiconductor memory device, the second embodiment of the present invention is described as follows.

According to the same fabrication process as the first embodiment of the invention, an interlayer insulating film 6a and node contact hole 7 are formed, and over the entire surface an undoped polysilicon film having a thickness of about 100 nm is formed by a CVD technique as a first polysilicon film. Ion implantation or thermal diffusion of phosphorus follows to dope the undoped polysilicon film to n+ polysilicon film 8. Over the entire surface a silicon oxide film having a thickness of about 400 nm is formed as a first insulating film by a CVD technique. Using a patterned photoresist film as a mask to cover at least the node contact hole 7, the silicon oxide film is anisotropically etched to form a core 9a.

Figure 6A:
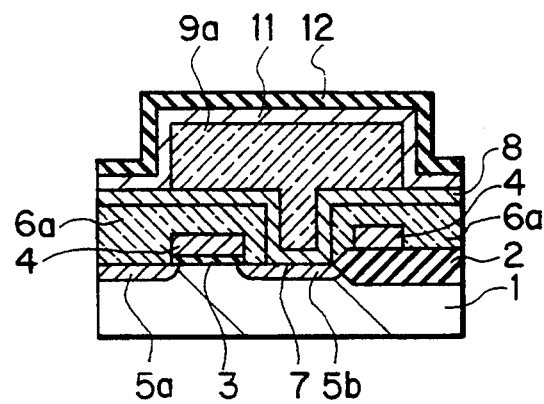
FIGS. 6a to 6c are cross-sectional views illustrating the process steps for fabricating a capacitor according to a second embodiment of the present invention.

As shown in FIG. 6a, after removing the photoresist film in the same manner as in the first embodiment, an undoped polysilicon film 11 having a thickness of about 150 nm is formed over the entire wafer surface by a CVD technique as a second polysilicon film. Over the entire wafer surface, a silicon oxide film 12 having a thickness of about 100 nm thick is formed by a CVD technique as a second insulating film.

Figure 6B:
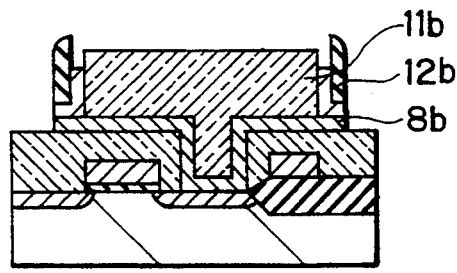

Thereafter, as shown FIG. 6b, silicon oxide film 12 is anisotropically etched back, leaving a part of the silicon oxide film 12 as a cylindrical spacer 12b. Using the cylindrical spacer 12b as a mask, phosphorus ion implantation is carried out to dope the exposed parts of undoped polysilicon film 11 to a n+ polysilicon film. Doped n+ polysilicon film 11 and n+ polysilicon film 8 directly beneath are etched by RIE with a mixed gas of $CCl_2F_2$ and $N_2$ in the same manner as in the first embodiment, to thereby leave an undoped-polysilicon-film spacer 11b and bottom electrode 8b.

Figure 6C:
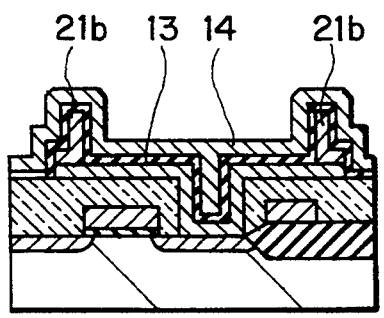

In the next step, as shown FIG. 6c, in the same manner as in the first embodiment, the core 9a and the cylindrical spacer 12b are removed, and then phosphorus ion implantation is carried out to dope undoped-polysilicon-film spacer 11b to cylindrical electrode 21b of n+ polysilicon film. A storage node electrode is thus formed comprising said bottom electrode 8b and said cylindrical electrode 21b. Then, a dielectric film 13 and a cell plate electrode 14 are formed.

As compared with the first embodiment, the second embodiment advantageously requires a fewer number of polysilicon etching steps.

In accordance with the method of present invention, a desired cylindrical storage node consisting of a bottom electrode of a first n+ polysilicon film and a cylindrical electrode of a second n+ polysilicon film ms fabricated so that the second polysilicon film undoped is first formed into a predetermined geometry and then doped to n+ type. In this manner, RIE etching to obtain the desired geometry is carried out when the second polysilicon film (undoped) has a low etch rate relative to other constituent films, subsequent doping by ion implantation does not substantially affect film thickness.

The present invention may be contrasted with the prior art where the corresponding silicon film is first doped to n+ type followed by RIE etching to obtain the desired geometry. Because undoped polysilicon has a lower etch rate than n+ polysilicon (relative to other constituent films), and furthermore because undoped polysilicon is more uniformly etched across the wafer diameter as compared to n+ polysilicon, the resulting cylindrical electrode of n+ polysilicon film prepared in accordance with the present invention has both a more uniform and higher height as compared to the corresponding prior art structure. As a result, the method of the present invention provides a memory device comprising memory cells having improved uniformity of storage capacitance among the plurality of memory cells and enhanced circuit operation relative to power supply voltage margin, noise margin and other characteristics.

The invention has thus been shown and described with reference to the above specific embodiments. However, it should be noted that the present invention is not to be construed as being limited to the details of these embodiments, and that various changes and modifications may be made within the scope of the appended claims.

What is claimed is:

1. A process for fabricating a semiconductor device having a capacitor, said process comprising the steps of:
   providing a semiconductor substrate having a transistor formed therein;
   forming an interlayer insulating film over a surface of the semiconductor substrate;
   forming in sequence an impurity-doped first polysilicon film and a first insulating film on a surface of said interlayer insulating film;
   selectively removing said first insulating film and said impurity-doped first polysilicon film to define a core made of said first insulating film and a bottom electrode made of said impurity-doped first polysilicon film;
   forming in sequence an impurity-undoped second polysilicon film and a second insulating film over said core and said bottom electrode;
   selectively removing said second insulating film until a portion of said impurity-undoped second polysilicon film covering a top surface of said core is exposed to thereby form a part of said second insulating film, wherein said part of said second insulating film serves as a cylindrical spacer which surrounds a sidewall of said core and a sidewall of said bottom electrode and wherein said impurity-undoped second polysilicon film is disposed between the sidewall of said core and said cylindrical spacer;
   selectively doping an impurity into said impurity-undoped second polysilicon film by using said cylindrical spacer as a mask to thereby divide said impurity-undoped second polysilicon film into an impurity-doped portion covering the top surface of said core and an impurity-undoped portion disposed between the sidewall of said core and said cylindrical spacer;
   selectively removing said impurity-doped portion by using said cylindrical spacer as a mask to thereby leave said impurity-undoped portion as an impurity-undoped-polysilicon-film spacer disposed between the sidewall of said core and said cylindrical spacer;
   removing said cylindrical spacer and said core while leaving said bottom electrode and said impurity-undoped-polysilicon-film spacer; and
   introducing an impurity into said impurity-undoped-polysilicon-film spacer to form a cylindrical electrode and to form a storage node electrode comprising said cylindrical electrode and said bottom electrode, wherein said storage node electrode serves as one electrode of said capacitor.

2. The process of claim 1, wherein at least a surface of said interlayer insulating film comprises a silicon nitride film; said first insulating film comprises one of a silicon oxide film, a PSG film and a BPSG film; said second insulating film comprises one of a silicon oxide film, a PSG film and a BPSG film; and said cylindrical spacer and said core are selectively removed with buffered hydrofluoric acid.

3. The process of claim 1, wherein said interlayer insulating film comprises a silicon oxide film; said first insulating film comprises one of a PSG film and a BPSG film; said second insulating film comprises one of a PSG film and a BPSG film; and said cylindrical spacer and said core are selectively removed by vapor etching with hydrogen fluoride gas.

4. The process of claim 1, wherein said interlayer insulating film comprises one of a silicon oxide film, a BSG film and a BPSG film; said first and second insulating films comprises a PSG film; and said cylindrical spacer and said core are selectively removed by wet etching with dilute hydrofluoric acid.

5. A process for fabricating a semiconductor device having a capacitor, said process comprising the steps of:
   providing a semiconductor substrate having a transistor formed therein;
   forming an interlayer insulating film over a surface of the semiconductor substrate;
   forming in sequence an impurity-doped first polysilicon film and a first insulating film on a surface of said interlayer insulating film;
   selectively removing said first insulating film to define a core made of said first insulating film;
   forming in sequence an impurity-undoped second polysilicon film and second insulating film over said core;
   selectively removing said second insulating film until a portion of said impurity-undoped second polysilicon film covering a top surface of said core is exposed to thereby form a part of said second insulating film, wherein said part of said second insulating film serves as a cylindrical spacer which surrounds a sidewall of said core and wherein said impurity-undoped second polysilicon film is disposed between the sidewall of said core and said cylindrical spacer;
   selectively doping an impurity into said impurity-undoped second polysilicon film by using said cylindrical spacer as a mask to thereby divide said impurity-undoped second polysilicon film into a first impurity-doped portion covering the top surface of said core, an impurity-undoped portion disposed between the sidewall of said core and said cylindrical spacer, and a second impurity-doped portion formed on a corresponding portion of said impurity-doped first polysilicon film;
   selectively removing said first and second impurity-doped portions and said corresponding portion of said impurity-doped first polysilicon film by using said cylindrical spacer as a mask to thereby leave said impurity-undoped portion as an impurity-undoped-polysilicon-film spacer wherein said impurity-undoped-polysilicon-film spacer is disposed between the sidewall of said core, said cylindrical spacer, and a bottom electrode of said impurity-doped first polysilicon film;
   removing said cylindrical spacer and said core while leaving said impurity-undoped-polysilicon-film spacer; and
   introducing an impurity into said impurity-undoped-polysilicon-film spacer to form a cylindrical electrode and to form a storage node electrode comprising said cylindrical electrode and said bottom electrode, wherein said storage node electrode serves as one electrode of said capacitor.

6. The process of claim 5, wherein at least a surface of said interlayer insulating film comprises a silicon nitride film; said first insulating film comprises one of a silicon oxide film, a PSG film and a BPSG film; said second insulating film comprises one of a silicon oxide film, a PSG film and a BPSG film; and said cylindrical spacer and said core are selectively removed with buffered hydrofluoric acid.

7. The process of claim 5, wherein said interlayer insulating film comprises a silicon oxide film; said first insulating film comprises one of a PSG film and a BPSG film; said second insulating film comprises one of a PSG film and a BPSG film; and said cylindrical spacer and said core are selectively removed by vapor etching with hydrogen fluoride gas.

8. The process of claim 5, wherein said interlayer insulating film comprises one of a silicon oxide film, a BSG film and a BPSG film; said first and second insulating films comprises a PSG film; and said cylindrical spacer and said core are selectively removed by wet etching with dilute hydrofluoric acid.

9. A process for fabricating a semiconductor device having a capacitor, said process comprising the steps of:
providing a semiconductor substrate having a transistor formed therein;
forming an interlayer insulating film over a surface of the semiconductor substrate;
forming in sequence a first polysilicon film and a first insulating film on a surface of said interlayer insulating film;
selectively removing said first insulating film to define a core made of said first insulating film;
selectively removing said first polysilicon film to define a bottom electrode made of said first polysilicon film;
forming in sequence an undoped second polysilicon film and a second insulating film over said core;
selectively removing said second insulating film until a portion of said undoped second polysilicon film covering a top surface of said core is exposed to thereby form a part of said second insulating film, wherein said part of said second insulating film serves as a cylindrical spacer which surrounds a sidewall of said core and wherein said second polysilicon film is disposed between the sidewall of said core and said cylindrical spacer;
selectively doping an impurity into said undoped second polysilicon film by using said cylindrical spacer as a mask to thereby divide said undoped polysilicon film into an impurity-doped portion covering the top surface of said core and an impurity-undoped portion disposed between the sidewall of said core and said cylindrical spacer;
selectively removing said impurity-doped portion by using said cylindrical spacer as a mask to thereby leave said impurity-undoped portion as an undoped-polysilicon-film spacer disposed between the sidewall of said core and said cylindrical spacer;
removing said cylindrical spacer and said core while leaving said bottom electrode and said undoped-polysilicon-film spacer; and
introducing an impurity into said undoped-polysilicon-film spacer to form a cylindrical electrode and to form a storage node electrode comprising said cylindrical electrode and said bottom electrode, wherein said storage node electrode serves as one electrode of said capacitor.

10. The process of claim 9, wherein at least a surface of said interlayer insulating film comprises a silicon nitride film; said first insulating film comprises one of a silicon oxide film, a PSG film and a BPSG film; said second insulating film comprises one of a silicon oxide film, a PSG film and a BPSG film; and said cylindrical spacer and said core are selectively removed with buffered hydrofluoric acid.

11. The process of claim 9, wherein said interlayer insulating film comprises a silicon oxide film; said first insulating film comprises one of a PSG film and a BPSG film; said second insulating film comprises one of a PSG film and a BPSG film; and said cylindrical spacer and said core are selectively removed by vapor etching with hydrogen fluoride gas.

12. The process of claim 9, wherein said interlayer insulating film comprises one of a silicon oxide film, a BSG film and a BPSG film; said first and second insulating films comprises a PSG film; and said cylindrical spacer and said core are selectively removed by wet etching with dilute hydrofluoric acid.

* * * * *

UNITED STATES PATENT AND TRADEMARK OFFICE
CERTIFICATE OF CORRECTION

PATENT NO.   : 5,436,187
DATED        : July 25, 1995
INVENTOR(S)  : Takaho Tanigawa It is certified that error appears in the above-indentified patent and that said Letters Patent is hereby corrected as shown below:

Col. 6, line 44, delete "ms" insert -- is --

Signed and Sealed this

Twenty-first Day of November, 1995

Attest:

BRUCE LEHMAN

Attesting Officer

Commissioner of Patents and Trademarks